United States Patent [19]

Naarmann et al.

[11] Patent Number: 4,468,509

[45] Date of Patent: Aug. 28, 1984

[54] REVERSIBLY OXIDIZABLE OR REDUCIBLE POLYMERS CONTAINING POLYENE UNITS, THEIR PREPARATION AND THEIR USE

[75] Inventors: Herbert Naarmann, Wattenheim; Volker Muench, Ludwigshafen; Klaus-Dieter Franz, Kelkheim, all of Fed. Rep. of Germany

[73] Assignee: BASF Aktiengesellschaft, Fed. Rep. of Germany

[21] Appl. No.: 526,665

[22] Filed: Aug. 25, 1983

[30] Foreign Application Priority Data

Sep. 1, 1982 [DE]  Fed. Rep. of Germany ....... 3232483

[51] Int. Cl.³ .............................................. C08F 12/32
[52] U.S. Cl. .................................... 526/284; 526/285; 526/234
[58] Field of Search ....................... 526/239, 282, 284

*Primary Examiner*—Paul R. Michl
*Assistant Examiner*—Alex H. Walker
*Attorney, Agent, or Firm*—Keil & Weinkauf

[57] ABSTRACT

Polymers which comprise polyene units possessing 5 or more conjugated aliphatic C-C double bonds and contain 1,9-disubstituted phenalenes as chemically bonded side groups are prepared by a process in which acetylene derivatives carrying 1,9-disubstituted phenalene groups are polymerized. The polymers obtained are used in the electrical industry or as reversible redox systems or for the antistatic treatment of plastics.

4 Claims, No Drawings

REVERSIBLY OXIDIZABLE OR REDUCIBLE POLYMERS CONTAINING POLYENE UNITS, THEIR PREPARATION AND THEIR USE

It is known that substituted acetylenes, eg. phenylacetylene, can be polymerized to give substituted polyenes, which can be converted to electrically conductive systems by complex formation with complexing agents, such as iodine or arsenic pentafluoride. In contrast to unsubstituted poly(acetylene), which becomes highly conductive as a result of complex formation (Synthetic Metals, Volume 1, Issue 2 (1979/1980), pages 101 et seq.), substituted poly(acetylenes) are oxidized by iodine to give only systems having a low electrical conductivity (Makromol. Chem. 182 (1981), 165–176). Complexes of poly(phenylacetylene) with electron acceptors, such as tetracyanoquinodimethane, are also known, but these likewise have only a low electrical conductivity (Y. Kuwane, T. Masuda and T. Higashimura, Polymer Journal, Volume 12, Issue 6 (1980), 387–391).

It is also known that the alternating $C_{13}$ hydrocarbon phenalenyl:

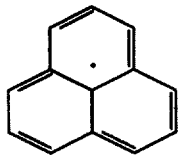

can occur in 3 oxidation states (cf. I. Murata, "Topics in Non-Benzoid Aromatic Systems", Vol. I (1976), 159). When this $\pi$ system is disturbed by 1,9-substitution, it retains its ability to exist in several oxidation states. For example, certain phenalenes have the following half-wave potentials ($E_{\frac{1}{2}}$):

9-hydroxyphenalen-1-one: $E_{\frac{1}{2}} = -0.95$ V
9-methoxyphenalen-1-one: $E_{\frac{1}{2}} = -1.11$ V
9-(N-methylamino)-phenalen-1-one: $E_{\frac{1}{2}} = -1.27$ V
1-ethoxy-9-(benzylthio)-phenalenium tetrafluoborate: $E_{\frac{1}{2}} = +0.1$ V; $E_{\frac{1}{2}} = -0.97$ V.

Half-wave potentials are defined in the usual textbooks on electrochemistry (cf. for example Organic Electrochemistry, M. N. Baizer, M. Dekker Verlag, New York, 1973).

It is an object of the present invention to provide novel polymers which are simple to prepare and have very good performance characteristics and an extended range of uses, in particular in the field of electrotechnology. In particular, it should be possible to convert the polymers reversibly to several oxidation stages, without causing damage to the products, by a procedure which is easy to carry out and gives reproducible products over a relativey long period of time; the polymers should be convertible, by means of conventional dopants, to highly electrically conductive systems having conductivities greater than $10^{-1}\,\Omega^{-1}\,\text{cm}^{-1}$, and should have good stability to atmospheric oxygen.

We have found that this object is achieved by polymers which comprise polyene units possessing not less than 5 conjugated aliphatic C—C double bonds in the polymer main chain, which contains, as chemically bonded side groups, 1,9-disubstituted phenalenes, the polymer main chain being linked to the 9-position of the phenalene side groups.

The object of the invention is achieved in particular by polymers which contain repeating units of the general formula (Ia) or (Ib) given in the description.

The object of the present invention is furthermore achieved by a process for the preparation of the above polymers, wherein an acetylene compound of the general formula (IIa) or (IIb) given in the description is polymerized.

The present invention furthermore relates to the use of the polymers in the electrical industry for the production of solar cells, for converting and fixing radiation and for the production of electric switches, electrochromic displays and electrodes, and their use as reversible redox systems and for the antistatic treatment of plastics.

Other objects of the present invention arise from the description below.

The novel polymers contain, in particular, repeating units of the general formula (Ia) or (Ib)

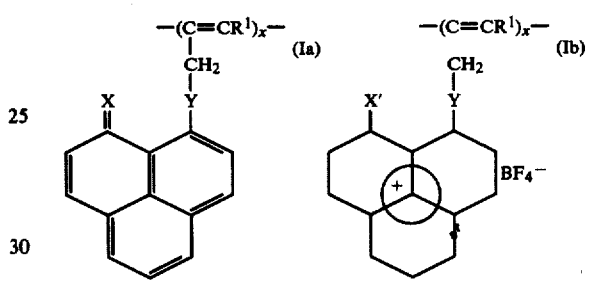

where $R^1$ is H, $C_1$–$C_4$-alkyl, $C_6$–$C_{12}$-cycloalkyl or aryl, X is O, S or $NR^2$, Y is —O—, —S— or —$NR^2$—, X' is —$OR^2$, —$SR^2$ or —$NR_2{}^2$, $R^2$ is H, $C_1$–$C_4$-alkyl, $C_6$–$C_{12}$-cycloalkyl or benzyl, and x is 5 to 500.

The polymers can contain from 0.1 to 100 mole % of the units of the general formula (Ia) or (Ib). The polymers contain in general from 10 to 1,000 polyene units possessing not less than 5 conjugated aliphatic C—C double bonds, and the molecular units have a molecular weight of from 500 to 50,000.

The novel polymers can be obtained by polymerization of an acetylene compound of the general formula (IIa) or (IIb).

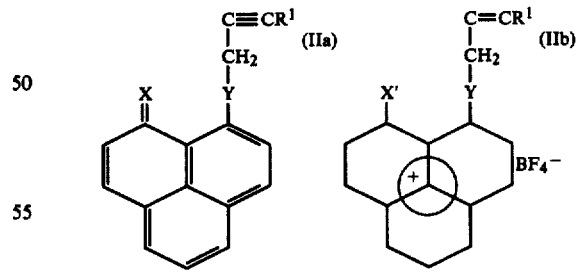

In these formulae, $R^1$, Y, X and X' have the above meanings. These monomers can be homopolymerized or can be copolymerized with one another. It is also possible to copolymerize the acetylene compound of the formula (IIa) or (IIb) with acetylene or another acetylene compound. The polymerization process used is a conventional one. For example, a Ziegler-Natta system or a Luttinger-Green catalyst is used as the polymerization initiator. The polymerization of the monomers is advantageously carried out in a solvent, eg. toluene or tetrahydrofuran or, if appropriate, dimethylformamide, ethanol or water, advantageously at from −80° to 50° C. Such processes are known, and are described in, for example, Angew. Chem., Int. Ed. 20 (1981), 361–381 (on pages 364 and 365).

The acetylene compounds of the formulae IIa and IIb are obtained by reacting a 1,9-disubstituted phenalene derivative of the general formula IIIa or IIIb

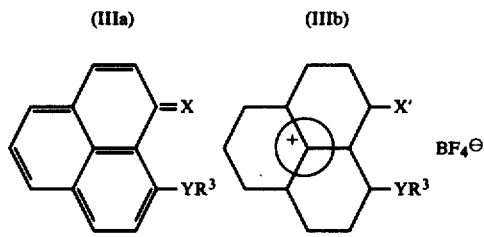

where X, X' and Y have the above meanings and $R^3$ is H, $C_1$–$C_4$-alkyl, $C_6$–$C_{12}$-cycloalkyl or benzyl, with an acetylene derivative of the general formula (IV)

(IV)

where Z is O, NH or S and $R^1$ has the above meanings.

The reaction of the phenalene derivative of the formula IIIa or IIIb with the acetylene derivative of the formula IV is advantageously carried out in an aromatic hydrocarbon, eg. toluene, an ether, eg. tetrahydrofuran, an alcohol, dimethylformamide, etc. The reaction is carried out at from +20° to 80° C. and suitable catalysts are bases, such as tertiary amines, eg. pyridine, or K tert.-butylate, used in catalytic amounts.

The novel polyenes can be complexed with conventionally used complexing agents and converted to highly electrically conductive systems having conductivities greater than $10^{-1} \Omega^{-1} cm^{-1}$. Examples of suitable complexing agents are oxidizing Lewis acids, eg. $AsF_5$, $SbF_5$, $SbCl_5$, $VF_5$ or $XeF_6$, non-oxidizing Lewis acids together with an oxidizing agent, eg. $PCl_5+Cl_2$, $AlCl_3+Cl_2$, or $PF_5+NOF$, oxidizing protic acids, eg. $HNO_3$, $H_2SO_4$ or $H_2SeO_4$, non-oxidizing protic acids which are intercalated by anodic oxidation, eg. $H_3PO_4$ or $CF_3SO_3H$, salts which are intercalated by anodic oxidation, eg. $NaF_6$ or $NaBF_4$, strongly electropositive metals, eg. Li, Na, K, Rb, Cs, Mg, Ca, Sr, Ba or the lanthanides, or tertiary or quanternary ammonium ions which are intercalated by cathodic reduction.

The above method gives polymers which have high electrical conductivity, improved electrochromic and electrochemical characteristics and improved redox behavior. The complexed polymers accordingly combine the advantageous properties of the phenalenes, eg. intense color, electrochromic behavior, etc., with the advantageous properties of doped poly(acetylene), eg. high electrical conductivity.

The novel conductive polymers can be used in the electrical industry for the production of solar cells, for converting and fixing electromagnetic radiation and for the production of electric switches, electrochromic displays and electrodes. The polymers according to the invention are also used as reversible redox systems or for the antistatic treatment of plastics.

EXAMPLE 1

(a) Preparation of 3-N-(phenalen-1'-on-9'-ylamino)-prop-1-yne [9-(propargylamino)-phenalen-1-one] of the formula:

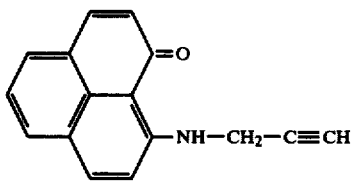

5 g (19.8 mmoles) of 9-butoxyphenalen-1-one are dissolved in 150 ml of chloroform, the solution is heated to 65° C., 5.46 g (6.43 ml; 99 mmoles) of propargylamine are added dropwise to the boiling solution in the course of 7 minutes and a small amount of a yellow precipitate is obtained. The mixture is refluxed for 6 hours and allowed to cool slowly overnight. Thereafter, the product is precipitated by means of 650 ml of n-hexane, filtered off under suction and dried for 5 hours under reduced pressure from an oil pump.

Yield: 2.65 g=57.3%, brownish yellow powder;
mp. 179°–181° C. (decomposition);
Thin-layer chromatography over silica gel 60 $F_{254}$ (Merck), mobile phase 8:2 toluene/ether mixture, $R_f$=0.288;
IR: (≡C—H) 3210 cm$^{-1}$, (C≡C) 2220 cm$^{-1}$;
1H—NMR in CDCl$_3$:=2.35 ppm (triplets 1H,≡C—H)=4.35 ppm (multiplet, 2H, —CH$_2$—),
δ=7–8.15 ppm (multiplet, 7H, phenalene)
Molecular weight (determined by mass spectrometry): 233 g
Formula according to analysis: $C_{16}H_{11.5}O_{1.15}N_{1.04}$;
(theory: $C_{16}H_{11}ON$).

(b) Polymerization of 9-(propargylamino)-phenalen-1-one:

1.5 g of 9-(propargylamino)-phenalen-1-one are dissolved in 100 ml of ethanol, and 0.5 g of a Luttinger catalyst (Co(NO$_3$)$_2$/NaBH$_4$) is added at −40° C. The solution is allowed to reach room temperature, while stirring. When 0° C. is reached, the polymerization begins.

Yield: 1.4 g of poly[3-(phenalen-1'-on-9'-yl)-aminoprop-1-yne],

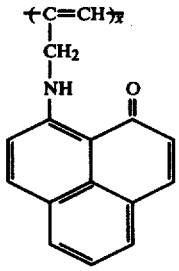

black powder, electrical conductivity δ=10$^{-10}$ S/cm.

(c) Complexing of poly[3-(phenalen-1'-on-9'-yl)-aminoprop-1-yne]:

(c1) 0.5 g of the polymer is pressed to give a tablet, which is made the anode in an electrolysis cell. Acetonitrile is used as the solvent, and tetrabutylammonium tetrafluoborate is used as the conductive salt. The resulting deep blue complex has the composition $[(C_{16}H_{11}NO)(BF_4)_{0.21}]_x$ and an electrical conductivity $\delta = 10^2$ S/cm.

(c2) 0.5 g of the polymer is exposed to $AsF_5$ for two days under a pressure of 0.5 bar. The resulting complex has the composition $[(C_{16}H_{11}NO)(AsF_5)_{0.12}]_x$ and a conductivity $\delta = 10^2$ S/cm.

(d) Electrochromic characteristics:

The deep blue complex $[(C_{16}H_{11}NO)(BF_4)_{0.21}]_x$ is made the cathode in an electrolysis cell, and is reduced. During this procedure, the color of the electrode changes from deep blue through pale brown to very dark brown ($E_j = -1$ V).

For example, the following compounds are synthesized in a similar manner:

| Example No. | | Preparation |
|---|---|---|
| ⬡—OC₂H₅<br>⬡—NH—CH₂—C≡CH | | from 9-butoxy-1-ethoxy-phenalenium tetrafluoroborate and propargylamine |
| ⬡=S<br>⬡—NH—CH₂—C≡CH | | from 9-butoxy-1-thio-phenalenone and propargylamine |
| ⬡=O<br>⬡—O—CH₂—C≡CH | | from 9-butoxyphenalen-1-one and propargyl alcohol |
| ⬡=N—CH₃<br>⬡—NH—CH₂—C≡CH | | from 1-(N—methylimino)-9-butoxyphenalen-1-one and propargylamine |
| ⬡=O<br>⬡—S—CH₂—C≡CH | | from 9-N—pyrrolidino-phenalen-1-one and propargylthiol |

The properties of the polymers obtained are shown in the Table below.

TABLE

| Polymer from No. | Electrical conductivity σ (S/cm) | Complex with iodine, absorption in mole % per monomer unit | Electrical conductivity of the iodine complex σ (S/cm) |
|---|---|---|---|
| 2 | $10^{-6}$ | 0.3 | $10^2$ |
| 3 | $10^{-8}$ | 0.75 | $10^2$ |
| 4 | $10^{-11}$ | 0.63 | $10^2$ |
| 5 | $10^{-9}$ | 0.8 | $10^3$ |
| 6 | $10^{-8}$ | 0.61 | $10^2$ |

We claim:

1. A polymer which comprises polyene units possessing 5 or more conjugated aliphatic C—C double bonds in the polymer main chain, which contains, as chemically bonded side groups, 1,9-disubstituted phenalenes, wherein the polymer main chain is linked to the 9-position of the phenalene side groups.

2. A polymer as claimed in claim 1, which contains repeating units of the formula (Ia) or (Ib)

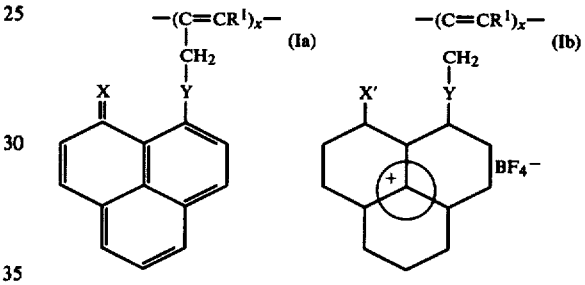

where $R^1$ is H, $C_1$-$C_4$-alkyl, $C_6$-$C_{12}$-cycloalkyl or aryl, X is O, S or $NR^2$, Y is —O—, —S— or —$NR^2$, X' is —$OR^2$, —$SR^2$ or —$NR_2^2$, $R^2$ is H, $C_1$-$C_4$-alkyl, $C_6$-$C_{12}$-cycloalkyl or benzyl, and x is 5 to 500.

3. A polymer as claimed in claim 1, which contains from 10 to 1,000 polyene units possessing 5 or more conjugated aliphatic C—C double bonds.

4. A polymer as claimed in claim 1, which contains from 0.1 to 100 mole % of the units of the formula (Ia) or (Ib).

* * * * *